United States Patent
Hsu et al.

(10) Patent No.: US 10,269,938 B2
(45) Date of Patent: Apr. 23, 2019

(54) SEMICONDUCTOR DEVICE STRUCTURE HAVING A DOPED PASSIVATION LAYER

(71) Applicant: Taiwan Semiconductor Manufacturing Co., Ltd., Hsinchu (TW)

(72) Inventors: Chi-Chin Hsu, Tainan (TW); Yi-Wei Chiu, Kaohsiung (TW); Wen-Zhong Ho, Tainan (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 144 days.

(21) Appl. No.: 15/211,409

(22) Filed: Jul. 15, 2016

(65) Prior Publication Data

US 2018/0019327 A1   Jan. 18, 2018

(51) Int. Cl.
| | |
|---|---|
| *H01L 29/66* | (2006.01) |
| *H01L 21/322* | (2006.01) |
| *H01L 29/78* | (2006.01) |
| *H01L 21/8234* | (2006.01) |
| *H01L 29/10* | (2006.01) |
| *H01L 21/762* | (2006.01) |

(52) U.S. Cl.
CPC .... *H01L 29/66803* (2013.01); *H01L 21/3221* (2013.01); *H01L 29/785* (2013.01); *H01L 21/76224* (2013.01); *H01L 21/823431* (2013.01); *H01L 29/1054* (2013.01); *H01L 29/66545* (2013.01); *H01L 29/66795* (2013.01); *H01L 29/7851* (2013.01)

(58) Field of Classification Search
CPC ............ H01L 29/66795; H01L 29/785; H01L 29/7851; H01L 21/823821; H01L 27/0924; H01L 21/823431; H01L 29/1054; H01L 27/0886
USPC ......................... 257/190, 328, 401
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |

(Continued)

*Primary Examiner* — David Chen
(74) *Attorney, Agent, or Firm* — Birch, Stewart, Kolasch & Birch, LLP

(57) ABSTRACT

A semiconductor device structure is provided. The semiconductor device structure includes a substrate having a base and a fin structure over the base. The fin structure has sidewalls. The semiconductor device structure includes a passivation layer over the sidewalls. The passivation layer includes dopants. The dopants include at least one element selected from group 4A elements, and the dopants and the substrate are made of different materials. The semiconductor device structure includes an isolation layer over the base and surrounding the fin structure and the passivation layer. A first upper portion of the fin structure and a second upper portion of the passivation layer protrude from the isolation layer. The semiconductor device structure includes a gate electrode over the first upper portion of the fin structure and the second upper portion of the passivation layer.

20 Claims, 19 Drawing Sheets

(56) References Cited

U.S. PATENT DOCUMENTS

| | | |
|---|---|---|
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2007/0084564 A1* | 4/2007 | Gupta .................. H01J 37/321 156/345.48 |
| 2010/0163927 A1* | 7/2010 | Pillarisetty ........ H01L 29/66431 257/194 |
| 2010/0207211 A1* | 8/2010 | Sasaki ............... H01L 29/66803 257/347 |
| 2012/0052664 A1* | 3/2012 | Fuse ................. H01L 21/26526 438/525 |
| 2012/0108042 A1* | 5/2012 | Liu .................... H01L 21/2236 438/513 |
| 2012/0112248 A1* | 5/2012 | Wu .................... H01L 21/2236 257/255 |
| 2013/0244392 A1* | 9/2013 | Oh .................... H01L 29/66477 438/299 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0187944 A1* | 7/2015 | Ching .................. H01L 29/785 257/190 |
| 2015/0214339 A1* | 7/2015 | Waite ................ H01L 29/66803 438/517 |
| 2015/0263003 A1 | 9/2015 | Lee et al. |
| 2015/0279974 A1* | 10/2015 | Godet ............... H01L 29/66803 438/283 |
| 2015/0380491 A1* | 12/2015 | Augendre ............... H01L 21/31 257/192 |
| 2016/0013184 A1* | 1/2016 | Alptekin ............. H01L 27/0886 257/401 |
| 2016/0380058 A1* | 12/2016 | Basker ............... H01L 21/32105 257/401 |

* cited by examiner

SEMICONDUCTOR DEVICE STRUCTURE HAVING A DOPED PASSIVATION LAYER

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
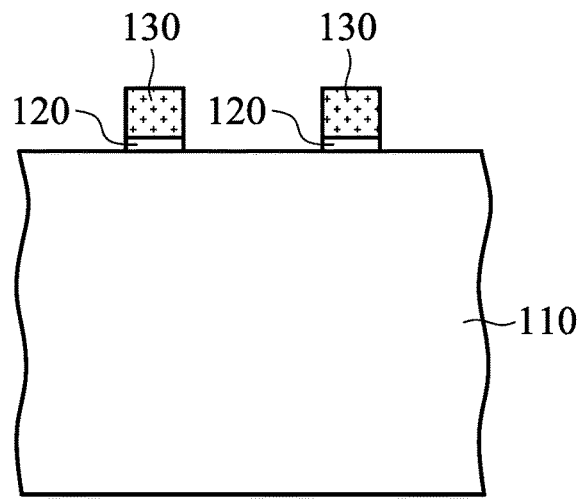
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1H are cross-sectional views of various stages of a process for forming a semiconductor device structure, in accordance with some embodiments.

As shown in FIG. 1A, a substrate 110 is provided, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, a mask layer 120 is deposited over the substrate 110, in accordance with some embodiments. The mask layer 120 includes oxide (such as silicon oxide), in accordance with some embodiments. The mask layer 120 is deposited using a chemical vapor deposition process or a physical vapor deposition process, in accordance with some embodiments.

As shown in FIG. 1A, a mask layer 130 is deposited over the mask layer 120, in accordance with some embodiments. The mask layers 120 and 130 are made of different materials, in accordance with some embodiments. The mask layer 130 is thicker than the mask layer 120, in accordance with some embodiments.

The mask layer 130 includes nitride (such as silicon nitride), in accordance with some embodiments. The mask layer 130 is deposited using a chemical vapor deposition process or a physical vapor deposition process, in accordance with some embodiments.

As shown in FIG. 1A, portions of the mask layers 120 and 130 are removed to expose a portion of the substrate 110, in accordance with some embodiments. The portions of the mask layers 120 and 130 are removed using a photolithography process and an etching process, in accordance with some embodiments.

Figure 1B:
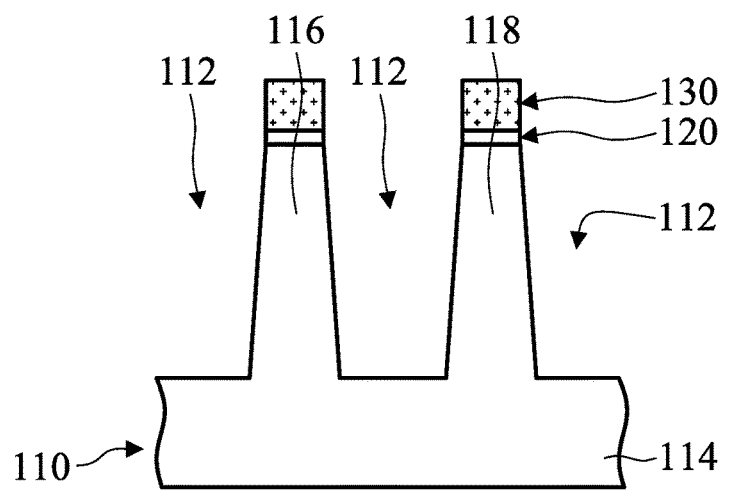

As shown in FIG. 1B, the portions of the substrate 110 exposed by the mask layers 120 and 130 are removed to form trenches 112 in the substrate 110, in accordance with some embodiments. The remaining substrate 110 includes a base 114 and fin structures 116 and 118, in accordance with some embodiments.

After the removal process, the substrate 110 remaining under the mask layers 120 and 130 forms the fin structures 116 and 118, in accordance with some embodiments. In some embodiments, the fin structures 116 and 118 are referred to as active regions. The fin structures 116 and 118 are over the base 114, in accordance with some embodiments.

Each of the fin structures 116 and 118 is located between the trenches 112, in accordance with some embodiments. The trench 112 is between the fin structures 116 and 118 to separate the fin structures 116 and 118, in accordance with some embodiments. The removal process includes a dry etching process or another suitable etching process.

Figure 1C:
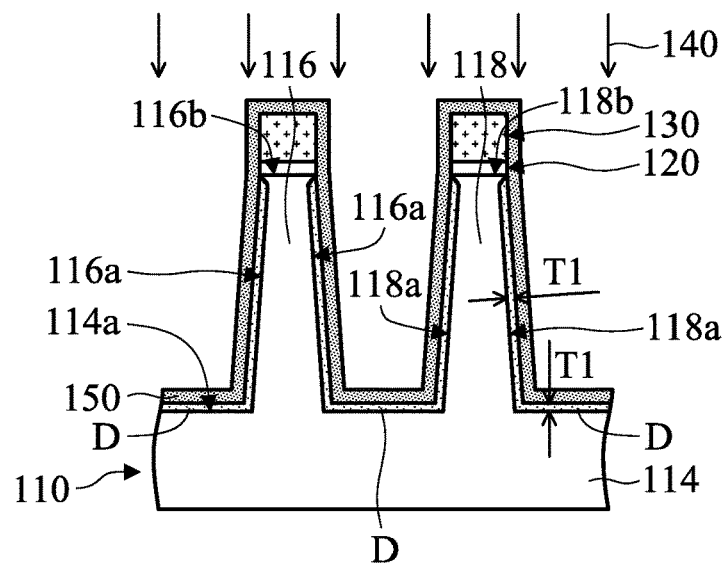

As shown in FIG. 1C, a plasma treatment 140 with a mixture of gases including hydrogen and nitrogen is performed over the substrate 110, in accordance with some embodiments. The plasma treatment 140 is able to repair broken bonds of the surface portion of the substrate 110, in accordance with some embodiments. Therefore, the plasma treatment 140 prevents the surface portion of the substrate 110 from being oxidized in subsequent processes, in accordance with some embodiments. As a result, the profile of the sidewalls 116a and 118a and the critical dimension (e.g. the width) of the fin structures 116 and 118 are maintained by the passivation layer.

As shown in FIG. 1C, a passivation layer D is formed over sidewalls 116a and 118a of the fin structures 116 and 118 and a top surface 114a of the base 114, in accordance with some embodiments. The passivation layer D is formed using an ion implantation process, a doping process, or another suitable process.

In some embodiments, a thickness T1 of the passivation layer D ranges from about 1 Å to about 10 Å. In some embodiments, the thickness T1 ranges from about 1 Å to about 5 Å. The doping energy (or the implantation energy) of the doping process (or the ion implantation process) ranges from about 0.01 KeV to about 0.1 KeV, in accordance with some embodiments. The dose of the doping process (or the ion implantation process) ranges from about $9E10/CM^2$ to about $10E13/CM^2$, in accordance with some embodiments.

The passivation layer D includes dopants (not shown), in accordance with some embodiments. The dopants include one or more elements selected from group 4A elements, in accordance with some embodiments. The dopants include carbon (C), germanium (Ge), tin (Sn), and/or lead (Pb).

The passivation layer D includes a base layer (not shown) and the dopants doped in the base layer, in accordance with some embodiments. The base layer includes surface portions of the fin structures 116 and 118 and the base 114 of FIG. 1B, in accordance with some embodiments. After the ion implantation process (or the doping process), the surface portions of the fin structures 116 and 118 and the base 114 of FIG. 1B and the dopants together form the passivation layer D, in accordance with some embodiments.

The dopants and the substrate 110 are made of different materials, in accordance with some embodiments. For example, the dopants include carbon (C) and/or germanium (Ge), and the substrate 110 includes silicon (Si). The dopants are able to strengthen the crystal structure of the base layer, in accordance with some embodiments. Therefore, the passivation layer D protects the sidewalls 116a and 118a and the top surface 114a thereunder from damage (e.g. oxidation) during subsequent processes.

In some embodiments, the passivation layer D is formed by two ion implantation processes. For example, the first ion implantation process is performed to implant a first element into the base layer, and thereafter the second ion implantation process is performed to implant a second element into the base layer.

The first element and the second element are selected from group 4A elements, in accordance with some embodiments. The atomic radius of the first element is greater than the atomic radius of the second element, and therefore the first element is able to prevent the second element from diffusing beyond a predetermined depth in the substrate 110. The first element includes germanium, and the second element includes carbon, in accordance with some embodiments.

The fin structure 116 has a top surface 116b adjacent to the sidewalls 116a, in accordance with some embodiments. The fin structure 118 has a top surface 118b adjacent to the sidewalls 118a, in accordance with some embodiments. Since the mask layers 120 and 130 cover the top surfaces 116b and 118b during the formation of the passivation layer D, the passivation layer D is not formed over the top surfaces 116b and 118b, in accordance with some embodiments. The passivation layer D exposes the top surfaces 116b and 118b, in accordance with some embodiments.

Figure 1D:
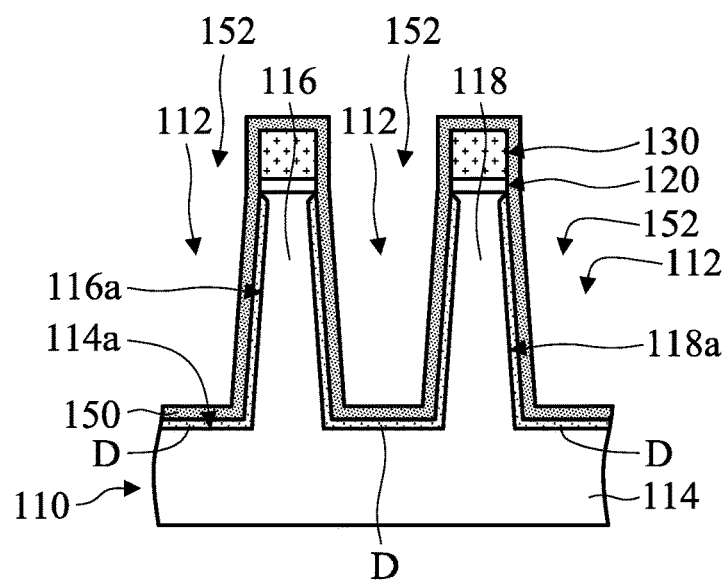

As shown in FIG. 1D, a liner layer 150 is formed over the base 114, the fin structures 116 and 118, the passivation layer D, and the mask layers 120 and 130, in accordance with some embodiments. The liner layer 150 conformally covers the base 114, the fin structures 116 and 118, the passivation layer D, and the mask layers 120 and 130, in accordance with some embodiments.

The liner layer 150 has trenches 152 in the trenches 112, in accordance with some embodiments. The liner layer 150 includes oxide (such as silicon oxide), in accordance with some embodiments. The liner layer 150 is formed using a chemical vapor deposition process (such as an atomic layer deposition process), in accordance with some embodiments.

Figure 1E:
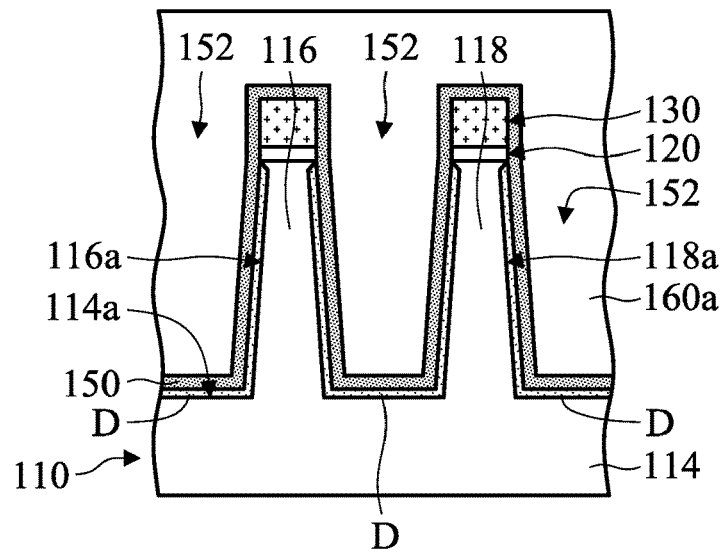

As shown in FIG. 1E, an isolation material layer 160a is formed over the liner layer 150, in accordance with some embodiments. The liner layer 150 separates the isolation material layer 160a and the substrate 110, in accordance with some embodiments.

The isolation material layer 160a fills the trenches 152, in accordance with some embodiments. The isolation material layer 160a includes oxide (such as silicon oxide), in accordance with some embodiments. The isolation material layer 160a is formed by a chemical vapor deposition (CVD) process, in accordance with some embodiments.

Thereafter, an annealing process is performed over the isolation material layer 160a, in accordance with some embodiments. The annealing temperature of the annealing process ranges from about 400° C. to about 500° C., in accordance with some embodiments. During the annealing process, the passivation layer D prevents the sidewalls 116a and 118a and the top surface 114a thereunder from being oxidized. As a result, the profile of the sidewalls 116a and 118a and the critical dimensions (e.g. the widths) of the fin structures 116 and 118 are maintained by the passivation layer D.

Figure 1F:
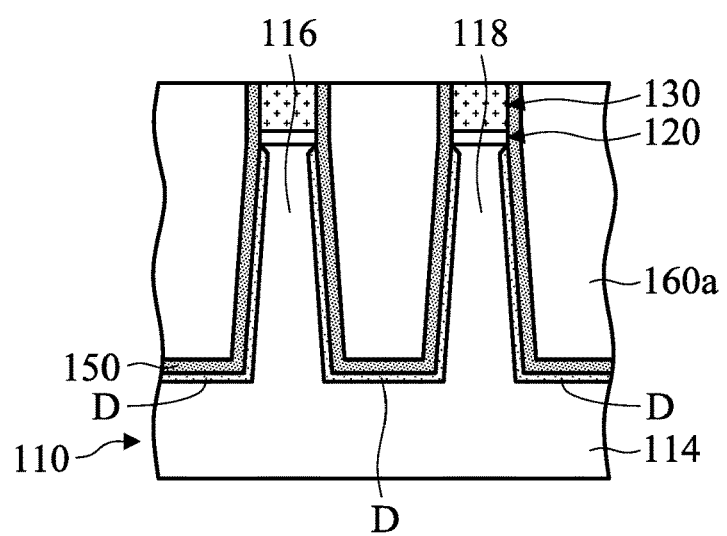

As shown in FIG. 1F, a planarization process is performed to remove the isolation material layer 160a and the liner layer 150 over the mask layer 130 until the mask layer 130 is exposed, in accordance with some embodiments. The planarization process includes a chemical mechanical polishing process, in accordance with some embodiments.

Figure 1G:
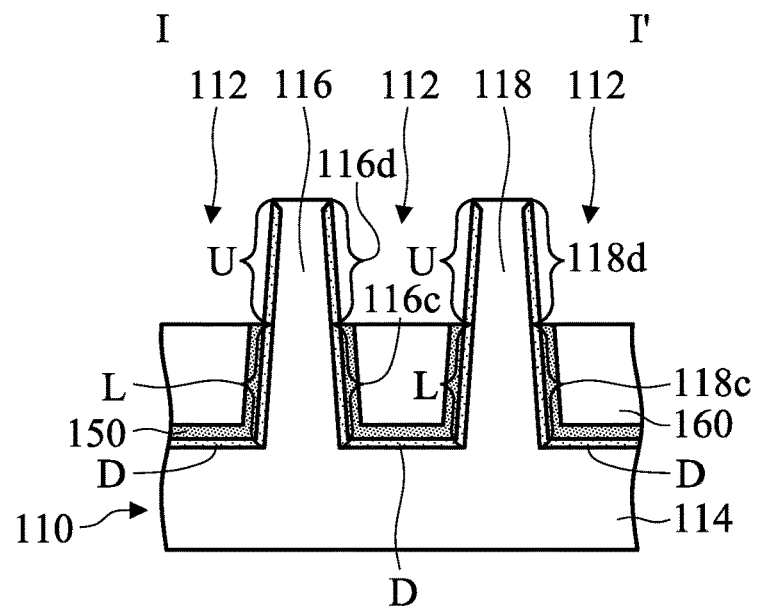

As shown in FIG. 1G, the mask layers 120 and 130 are removed, in accordance with some embodiments. The removal process includes an etching process, in accordance with some embodiments. As shown in FIG. 1G, an etching back process is performed on the isolation material layer 160a and the liner layer 150 to remove portions of the isolation material layer 160a and the liner layer 150 in the trenches 112, in accordance with some embodiments. The remaining isolation material layer 160a forms an isolation layer 160, in accordance with some embodiments.

The isolation layer 160 surrounds lower portions 116c and 118c of the fin structures 116 and 118 and lower portions L of the passivation layer D, in accordance with some embodiments. The upper portions 116d and 118d of the fin structures 116 and 118 and upper portions U of the passivation layer D protrude from the isolation layer 160, in accordance with some embodiments.

Figure 1H:
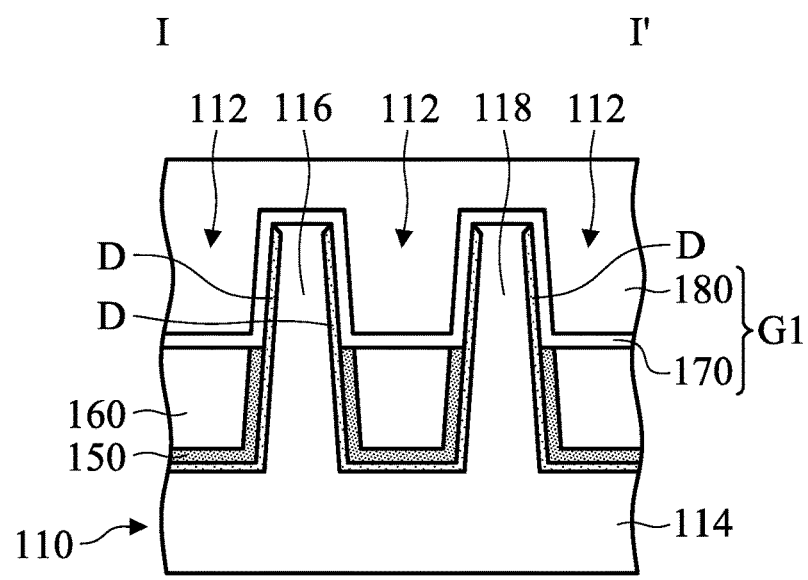
Figure 2A:
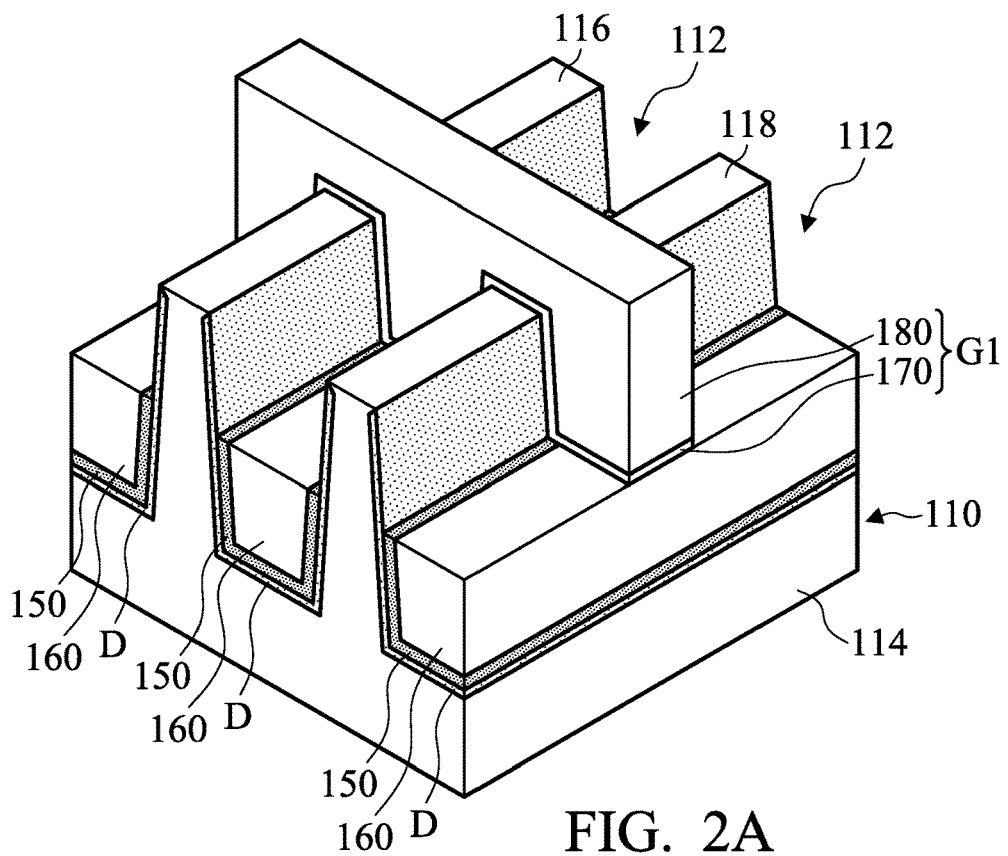
FIG. 2A is a perspective view of the semiconductor device structure of FIG. 1H, in accordance with some embodiments.
Figure 2B:
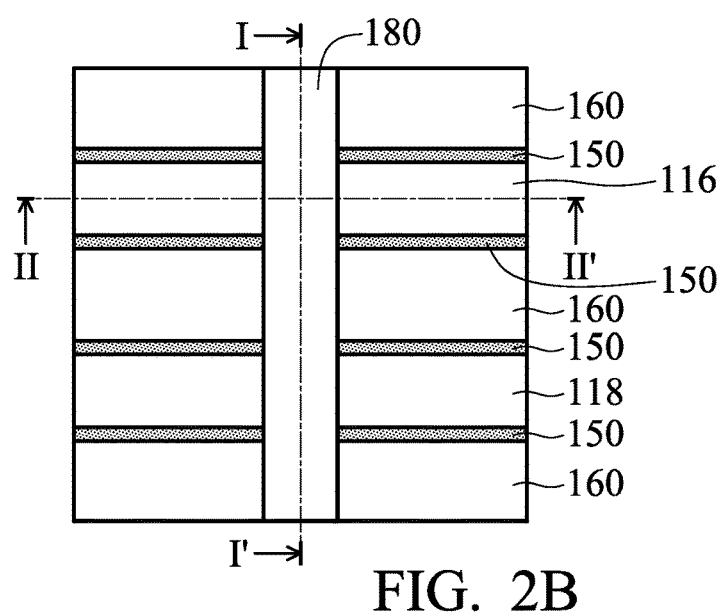
FIG. 2B is a top view of the semiconductor device structure of FIG. 2A, in accordance with some embodiments.
Figure 3A:
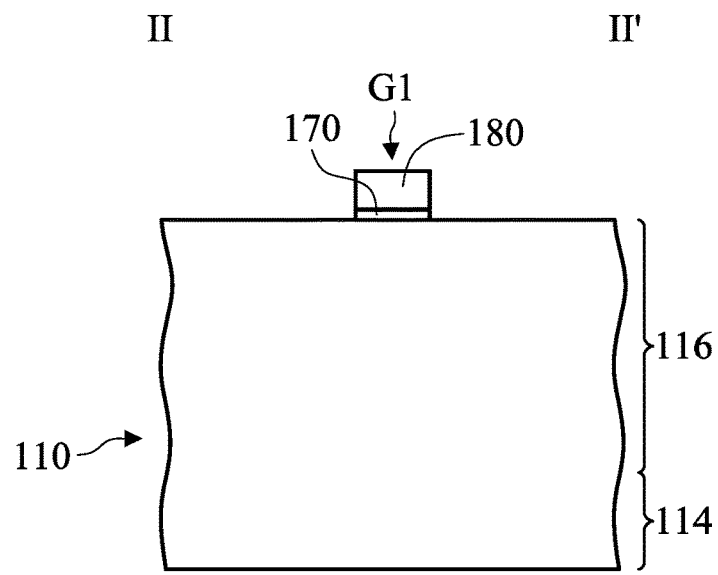
FIGS. 3A-3G are cross-sectional views of various stages of a process for forming a semiconductor device structure, in accordance with some embodiments.

FIG. 2A is a perspective view of the semiconductor device structure of FIG. 1H, in accordance with some embodiments. FIG. 2B is a top view of the semiconductor device structure of FIG. 2A, in accordance with some embodiments. FIG. 1H is a cross-sectional view illustrating the semiconductor device structure along a sectional line I-I' in FIG. 2B, in accordance with some embodiments. FIG. 3A is a cross-sectional view illustrating the semiconductor device structure along a sectional line II-IF in FIG. 2B, in accordance with some embodiments.

As shown in FIG. 1H, 2A, 2B, and 3A, a gate dielectric layer 170 and a gate electrode 180 are formed over the fin structures 116 and 118, the passivation layer D, the liner layer 150, and the isolation layer 160, in accordance with some embodiments. The gate dielectric layer 170 is in direct contact with the fin structures 116 and 118, the passivation layer D, the liner layer 150, and the isolation layer 160, in accordance with some embodiments. The gate dielectric layer 170 conformally covers the fin structures 116 and 118, the passivation layer D, the liner layer 150, and the isolation layer 160, in accordance with some embodiments.

The gate electrode 180 is formed over the gate dielectric layer 170, in accordance with some embodiments. The gate dielectric layer 170 is positioned between the gate electrode 180 and the fin structures 116 and 118, in accordance with some embodiments. The gate dielectric layer 170 is also positioned between the gate electrode 180 and the passivation layer D, in accordance with some embodiments. The gate electrode 180 and the gate dielectric layer 170 together form a gate stack G1, in accordance with some embodiments. Portions of the gate stack G1 are in the trenches 112, in accordance with some embodiments.

Figure 3B:
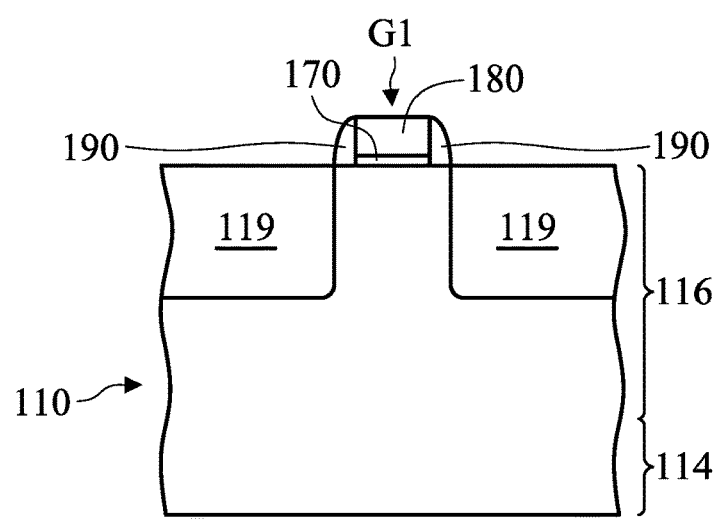

FIGS. 3A-3G are cross-sectional views of various stages of a process for forming a semiconductor device structure, in accordance with some embodiments. After the step of FIG. 3A, as shown in FIG. 3B, a spacer layer 190 is formed over sidewalls of the gate stack G1, in accordance with some embodiments. The spacer layer 190 surrounds the gate stack G1, in accordance with some embodiments. The spacer layer 190 is positioned over the fin structures 116 and 118, the passivation layer D, and the isolation layer 160, in accordance with some embodiments.

The spacer layer 190 includes insulating materials, such as silicon oxide or silicon nitride, in accordance with some embodiments. The formation of the spacer layer 190 includes a deposition process and an anisotropic etching process, in accordance with some embodiments.

As shown in FIG. 3B, doped regions 119 are formed in the fin structures 116 and 118, in accordance with some embodiments. The formation of the doped regions 119 includes as an ion implantation process, in accordance with some embodiments. The ion implantation process is performed to introduce p-type impurities (e.g., boron) or n-type impurities (e.g., phosphorus) into the fin structures 116 and 118, in accordance with some embodiments. The doped regions 119 are a doped source region and a doped drain region, in accordance with some embodiments. The doped regions 119 are located at the two opposite sides of the gate stack G1, in accordance with some embodiments.

Figure 3C:
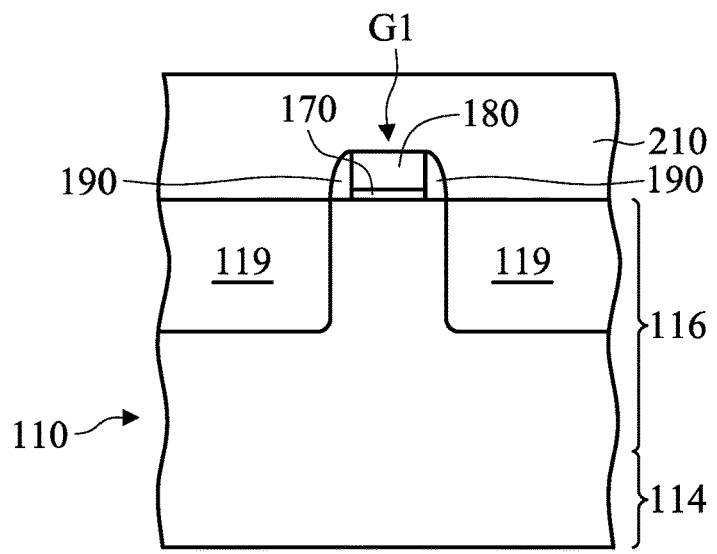
Figure 3D:
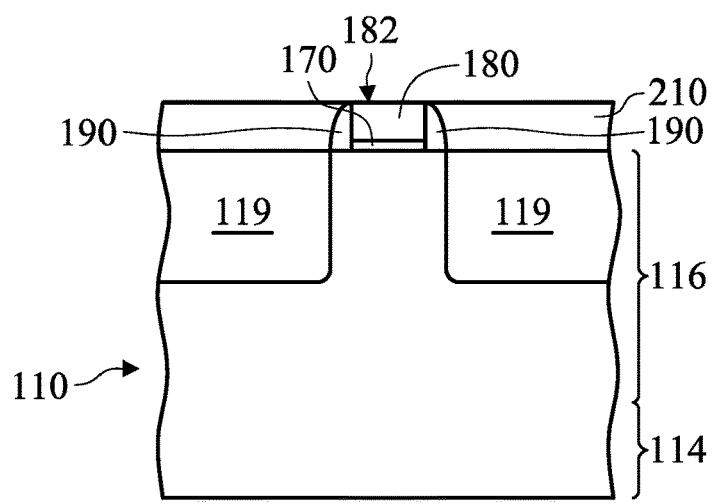

As shown in FIG. 3C, an insulating layer 210 is formed over the semiconductor substrate 110, the gate stack G1, and the spacer layer 190, in accordance with some embodiments. As shown in FIG. 3D, a planarization process is then performed on the insulating layer 210 until a top surface 182 of the gate electrode 180 is exposed, in accordance with some embodiments. The planarization process includes a chemical mechanical polishing (CMP) process, in accordance with some embodiments.

Figure 3E:
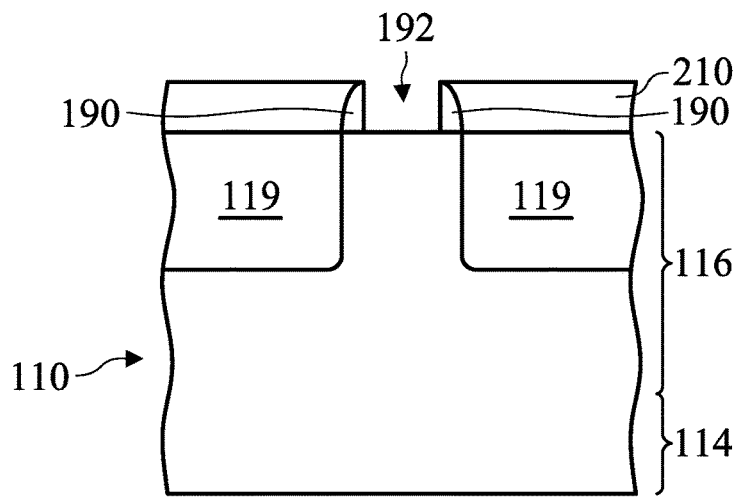

As shown in FIG. 3E, the gate electrode 180 and the gate dielectric layer 170 are removed, in accordance with some embodiments. The removal process includes a wet etching process, in accordance with some embodiments. After the removal process, an opening 192 is formed in the spacer layer 190, in accordance with some embodiments.

Figure 3F:
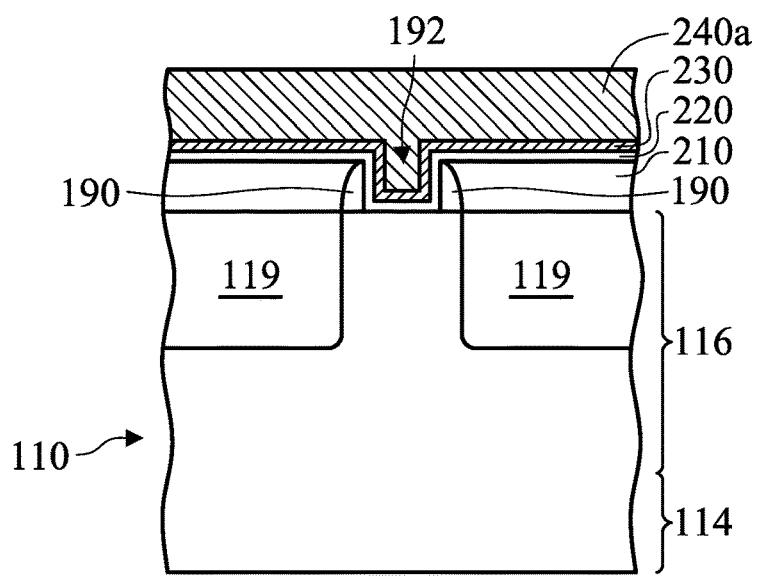

As shown in FIG. 3F, a gate dielectric layer 220 is formed to cover a bottom surface of the opening 192, in accordance with some embodiments. Thereafter, a work function metal layer 230 is deposited over the gate dielectric layer 220, in accordance with some embodiments.

Afterwards, a gate electrode material layer 240a (also called a metal gate electrode material layer) is deposited over the work function metal layer 230 to fill the opening 192, in accordance with some embodiments. The gate electrode material layer 240a is made of a suitable metal material, such as aluminum, tungsten, gold, platinum, cobalt, another suitable metal, an alloy thereof, or a combination thereof, in accordance with some embodiments.

Figure 3G:
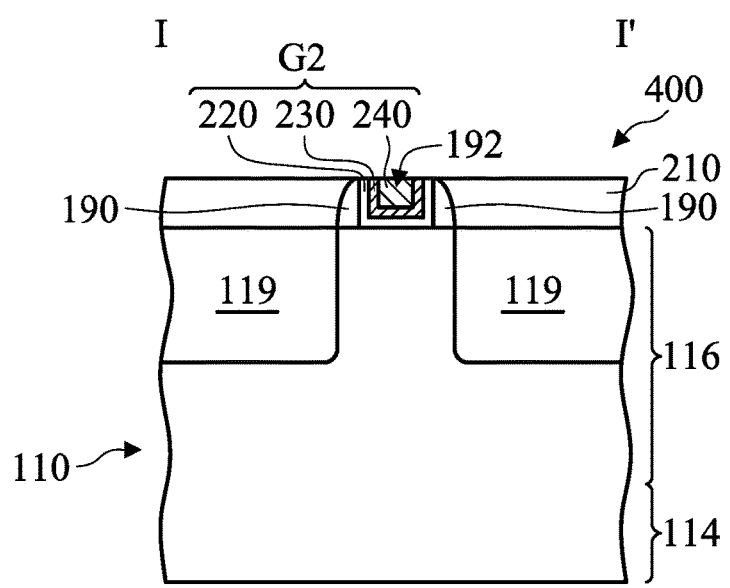
Figure 4A:
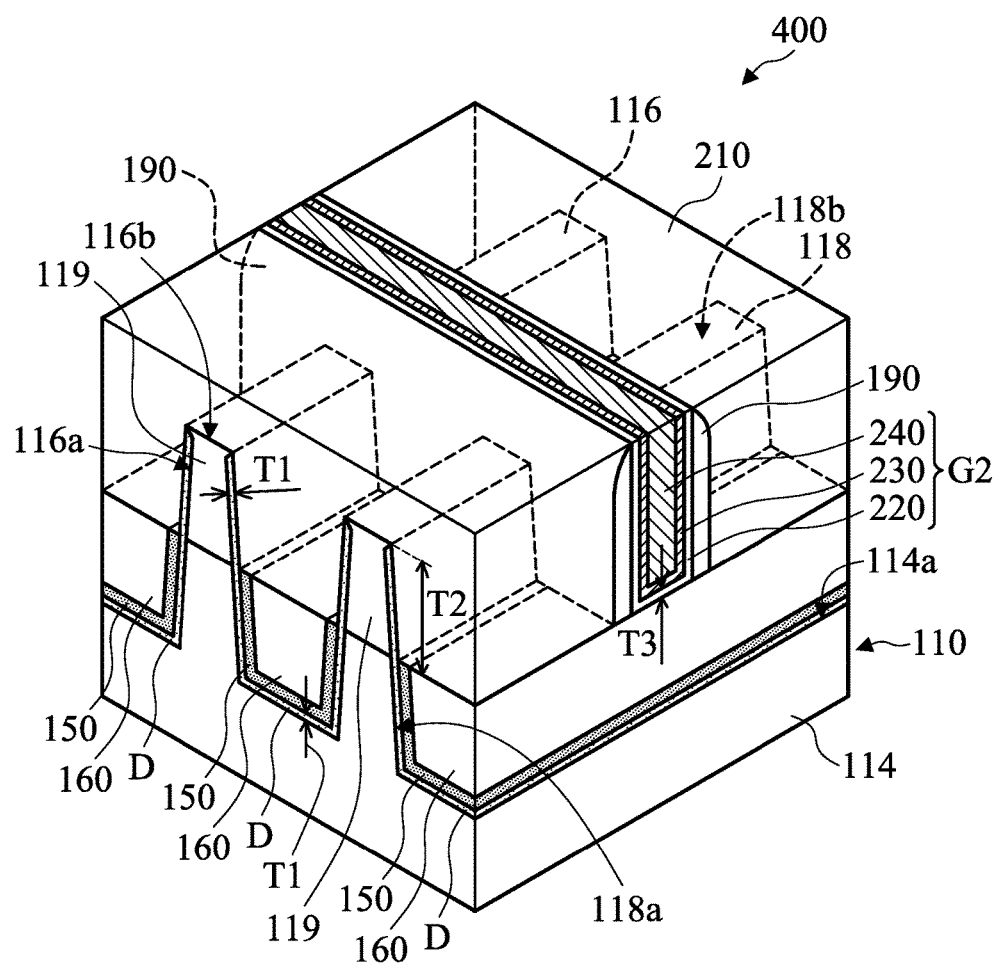
FIG. 4A is a perspective view of the semiconductor device structure of FIG. 3G, in accordance with some embodiments.
Figure 4B:
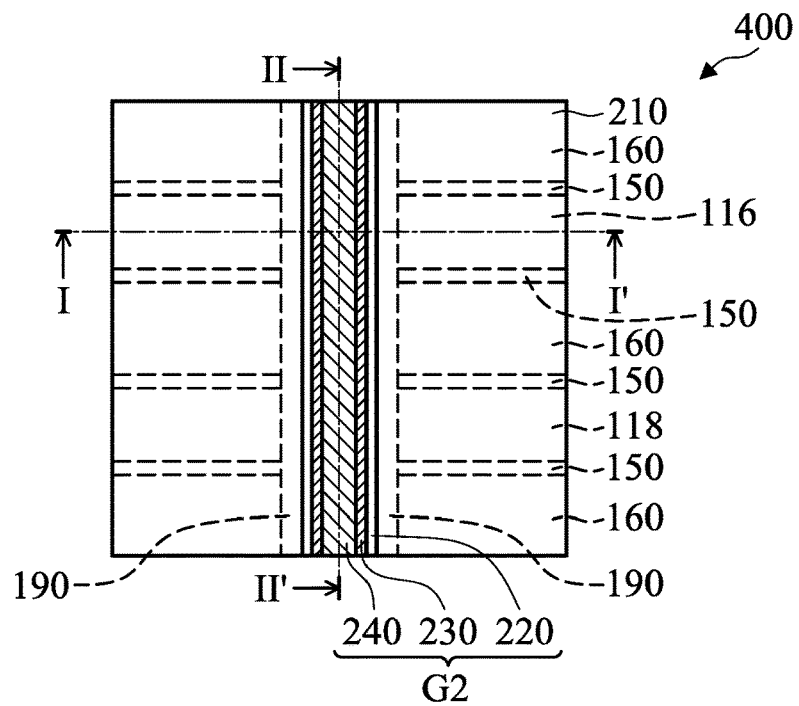
FIG. 4B is a top view of the semiconductor device structure of FIG. 4A, in accordance with some embodiments.
Figure 4C:
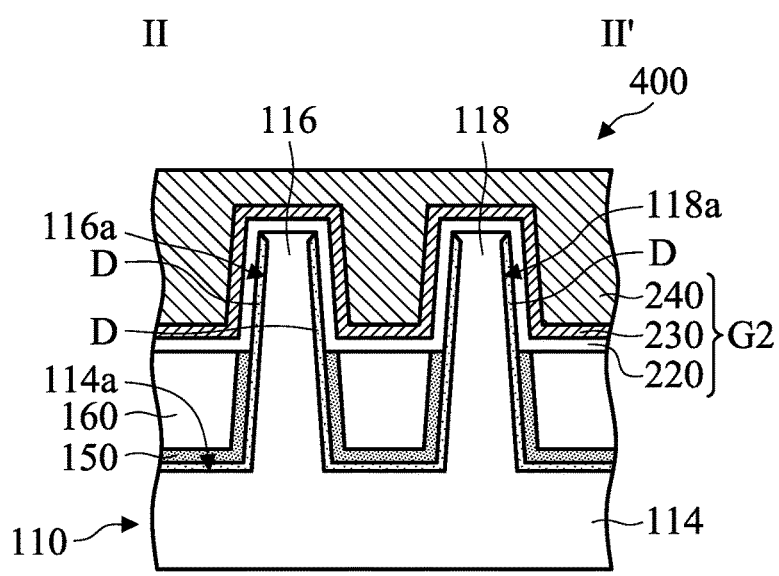
FIG. 4C is a cross-sectional view illustrating the semiconductor device structure along a sectional line II-IF in FIG. 4B, in accordance with some embodiments.

FIG. 4A is a perspective view of the semiconductor device structure of FIG. 3G, in accordance with some embodiments. FIG. 4B is a top view of the semiconductor device structure of FIG. 4A, in accordance with some embodiments. FIG. 4C is a cross-sectional view illustrating the semiconductor device structure along a sectional line II-II' in FIG. 4B, in accordance with some embodiments. FIG. 3G is a cross-sectional view illustrating the semiconductor device structure along a sectional line I-I' in FIG. 4B, in accordance with some embodiments.

As shown in FIGS. 3G and 4A, a planarization process is performed to remove the gate electrode material layer 240a, the work function metal layer 230, and the gate dielectric layer 220 outside of the opening 192, in accordance with some embodiments. The gate electrode material layer 240a remaining in the opening 192 forms a gate electrode 240, in accordance with some embodiments. The gate dielectric layer 220 is positioned between the gate electrode 240 and the fin structures 116 and 118 so as to separate the gate electrode 240 from the fin structures 116 and 118, in accordance with some embodiments.

As shown in FIGS. 4A-4C, the gate dielectric layer 220 is positioned between the gate electrode 240 and the passivation layer D so as to separate the gate electrode 240 from the passivation layer D, in accordance with some embodiments. The gate dielectric layer 220 conformally covers the fin structures 116 and 118 and the passivation layer D, in accordance with some embodiments. The gate dielectric layer 220 is in direct contact with the fin structures 116 and 118 and the passivation layer D, in accordance with some embodiments.

As shown in FIG. 4A, the thickness T2 of the doped region 119 is greater than the thickness T1 of the passivation layer D, in accordance with some embodiments. The thickness T3 of the gate dielectric layer 220 is greater than the thickness T1 of the passivation layer D, in accordance with some embodiments.

In this step, a semiconductor device structure 400 is formed. In the semiconductor device structure 400, the gate electrode 240, the work function metal layer 230, and the gate dielectric layer 220 remaining in the opening 192 form a gate stack G2, in accordance with some embodiments. The gate stack G2 is also referred to as a metal gate stack, in accordance with some embodiments.

Figure 5A:
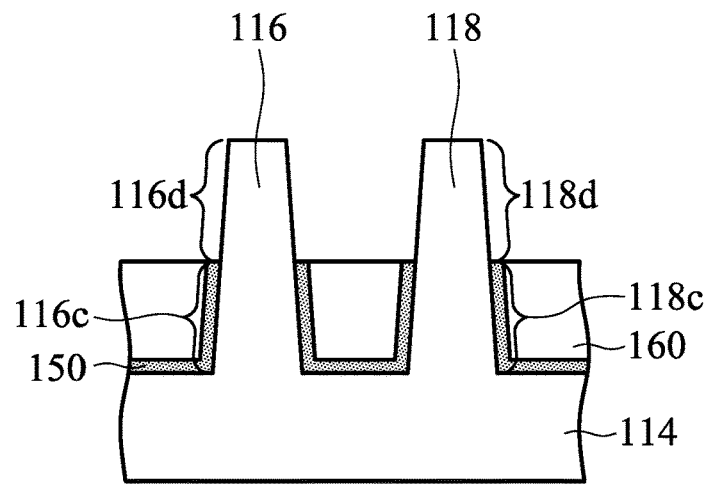
FIGS. 5A-5C are cross-sectional views of various stages of a process for forming a semiconductor device structure, in accordance with some embodiments.
Figure 5B:
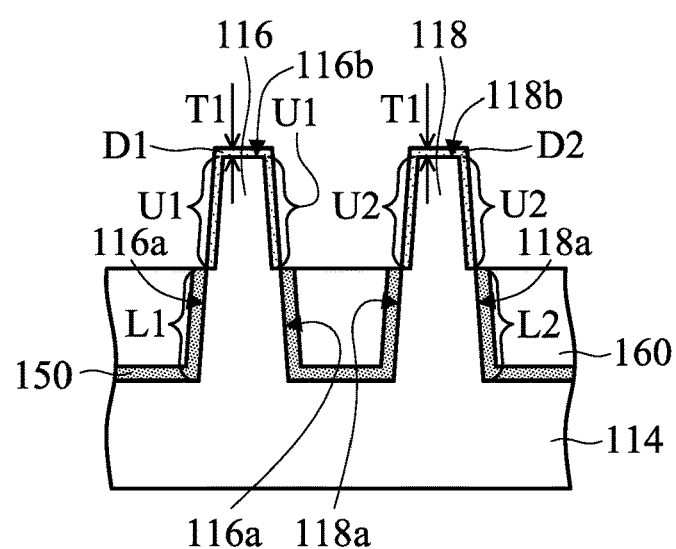
Figure 5C:
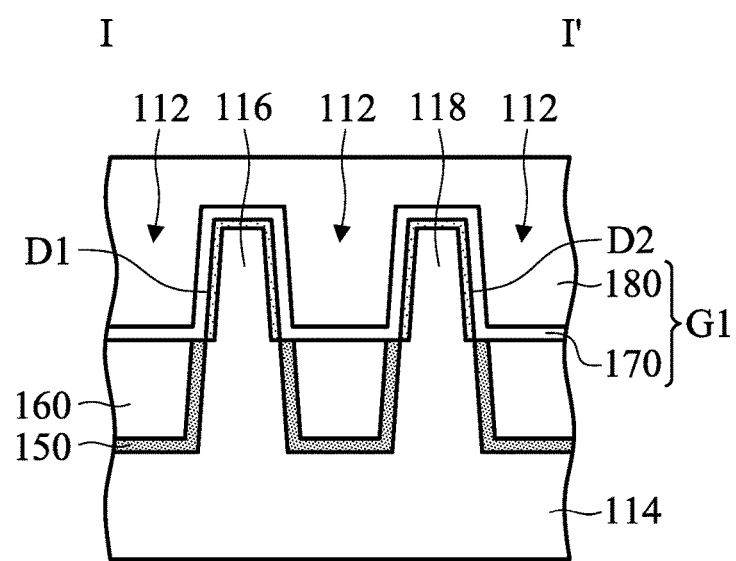

FIGS. 5A-5C are cross-sectional views of various stages of a process for forming a semiconductor device structure, in accordance with some embodiments. After the steps of FIGS. 1A-1G but without forming the passivation layer D, as shown in FIG. 5A, the isolation layer 160 surrounds lower portions 116c and 118c of the fin structures 116 and 118, in accordance with some embodiments. The upper portions 116d and 118d of the fin structures 116 and 118 protrude from the isolation layer 160, in accordance with some embodiments.

As shown in FIG. 5B, a passivation layer D1 is formed over the top surface 116b of the fin structure 116 and upper portions U1 of the sidewalls 116a of the fin structure 116, in accordance with some embodiments. As shown in FIG. 5B, a passivation layer D2 is formed in the top surface 118b of the fin structure 118 and upper portions U2 of the sidewalls 118a of the fin structure 118, in accordance with some embodiments.

The passivation layers D1 and D2 are formed using an ion implantation process, a doping process, or another suitable process. In some embodiments, a thickness T1 of the passivation layer D1 or D2 ranges from about 1 Å to about 10 Å. In some embodiments, the thickness T1 ranges from about 1 Å to about 5 Å.

The passivation layers D1 and D2 include dopants (not shown), in accordance with some embodiments. The dopants include one or more elements selected from group 4A elements, in accordance with some embodiments. The dopants include carbon (C), germanium (Ge), tin (Sn), and/or lead (Pb).

The passivation layers D1 and D2 include base layers (not shown) and the dopants doped in the base layers, in accordance with some embodiments. The base layers are surface portions of the fin structures 116 and 118 of FIG. 5A, in accordance with some embodiments. After the ion implantation process (or the doping process), the surface portions of the fin structures 116 and 118 of FIG. 5A and the dopants together form the passivation layers D1 and D2, in accordance with some embodiments.

The dopants and the substrate 110 are made of different materials, in accordance with some embodiments. For example, the dopants include carbon (C) and/or germanium (Ge), and the substrate 110 includes silicon (Si). The dopants are able to strengthen the crystal structures of the base layers, in accordance with some embodiments. Therefore, the passivation layers D1 and D2 prevent the upper portions U1 and U2 of the sidewalls 116a and 118a and the top surfaces 116b and 118b thereunder from damage (e.g. oxidation) during subsequent processes. As a result, the critical dimensions (e.g. the widths and the heights) of the fin structures 116 and 118 are maintained by the passivation layers D1 and D2.

In some embodiments, the passivation layers D1 and D2 are formed by two ion implantation processes. For example, the first ion implantation process is performed to implant a first element into the base layers, and thereafter the second ion implantation process is performed to implant a second element into the base layers.

The first element and the second element are selected from group 4A elements, in accordance with some embodiments. The atomic radius of the first element is greater than the atomic radius of the second element, and therefore the first element is able to prevent the second element from diffusing beyond a predetermined depth in the substrate 110. The first element includes germanium, and the second element includes carbon, in accordance with some embodiments.

Since the isolation layer 160 covers lower portions L1 and L2 of the sidewalls 116a and 118a during the formation of the passivation layers D1 and D2, the passivation layers D1 and D2 are not formed over the lower portions L1 and L2 of the sidewalls 116a and 118a, in accordance with some embodiments.

Figure 6A:
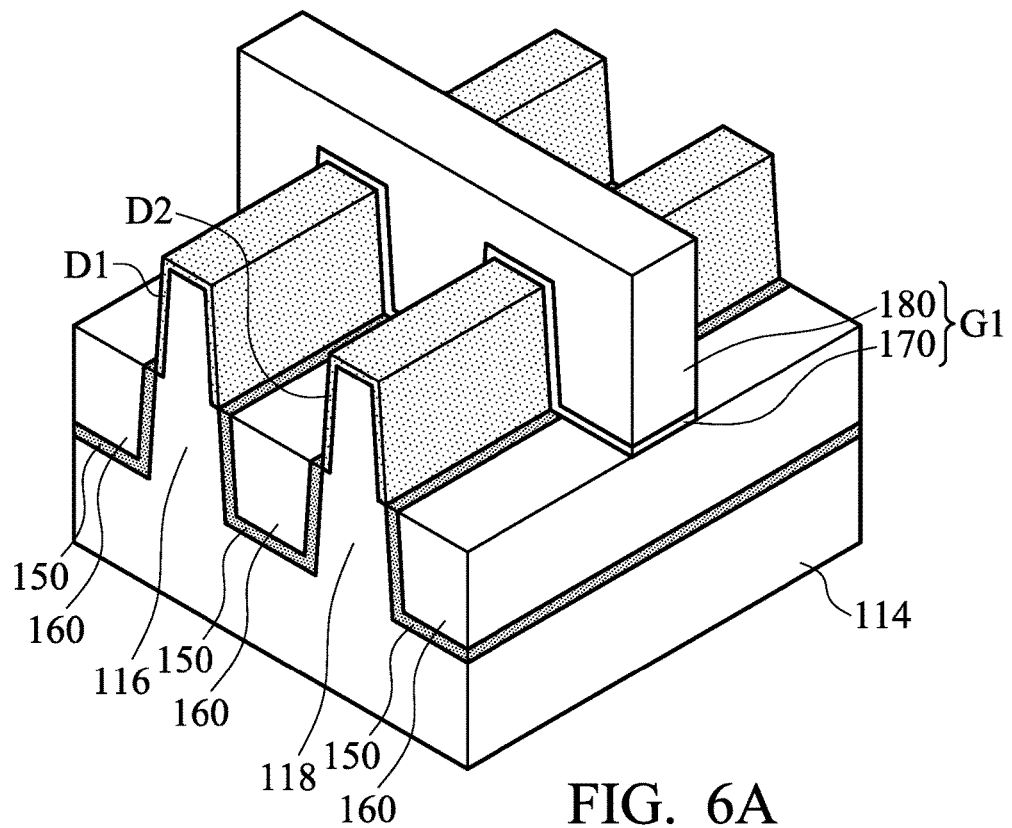
FIG. 6A is a perspective view of the semiconductor device structure of FIG. 5C, in accordance with some embodiments.
Figure 6B:
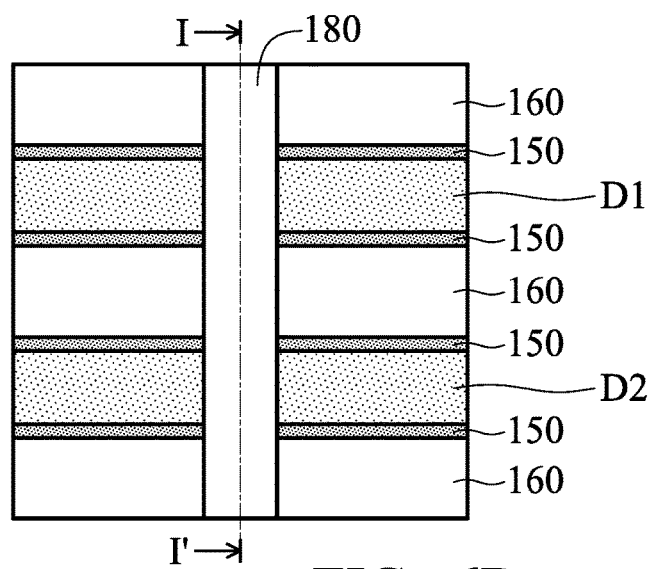
FIG. 6B is a top view of the semiconductor device structure of FIG. 6A, in accordance with some embodiments.

FIG. 6A is a perspective view of the semiconductor device structure of FIG. 5C, in accordance with some embodiments. FIG. 6B is a top view of the semiconductor device structure of FIG. 6A, in accordance with some embodiments. FIG. 5C is a cross-sectional view illustrating the semiconductor device structure along a sectional line I-I' in FIG. 6B, in accordance with some embodiments.

As shown in FIGS. 5C, 6A, and 6B, a gate dielectric layer 170 and a gate electrode 180 are formed over the fin structures 116 and 118, the passivation layers D1 and D2, the liner layer 150, and the isolation layer 160, in accordance with some embodiments. The gate dielectric layer 170 is in direct contact with the fin structures 116 and 118, the passivation layer D, the liner layer 150, and the isolation layer 160, in accordance with some embodiments. The gate dielectric layer 170 conformally covers the fin structures 116 and 118, the passivation layer D, the liner layer 150, and the isolation layer 160, in accordance with some embodiments.

The gate electrode 180 is formed over the gate dielectric layer 170, in accordance with some embodiments. The gate dielectric layer 170 is positioned between the gate electrode 180 and the fin structures 116 and 118, in accordance with some embodiments. The gate dielectric layer 170 is also positioned between the gate electrode 180 and the passivation layer D, in accordance with some embodiments. The gate electrode 180 and the gate dielectric layer 170 together form a gate stack G1, in accordance with some embodiments. Portions of the gate stack G1 are in the trenches 112, in accordance with some embodiments.

Figure 7A:
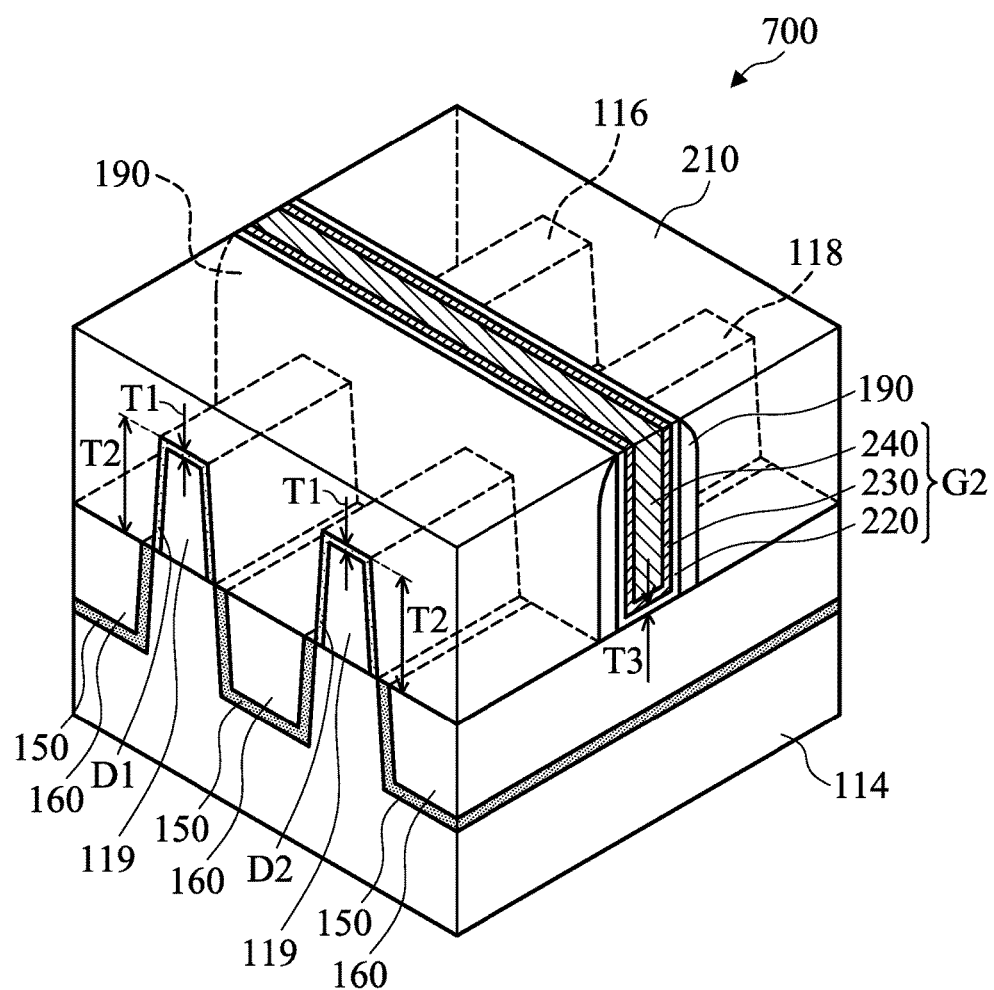
FIG. 7A is a perspective view of a semiconductor device structure, in accordance with some embodiments.
Figure 7B:
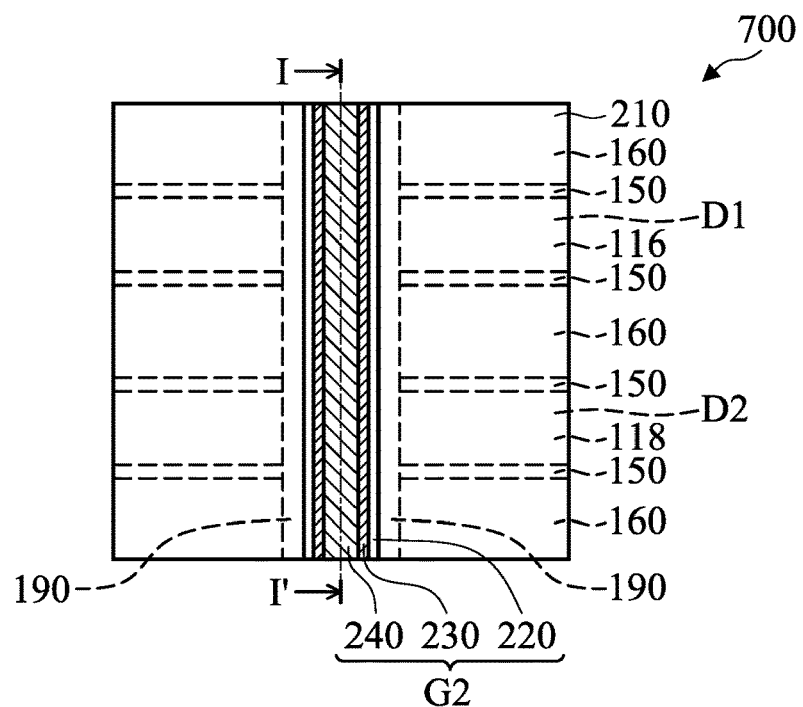
FIG. 7B is a top view of the semiconductor device structure of FIG. 7A, in accordance with some embodiments.
Figure 7C:
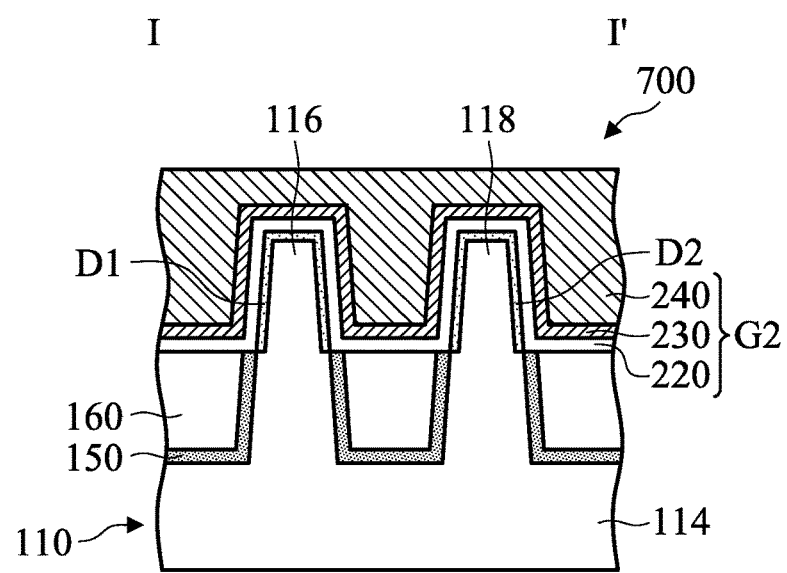
FIG. 7C is a cross-sectional view illustrating the semiconductor device structure along a sectional line I-I' in FIG. 7B, in accordance with some embodiments.

FIG. 7A is a perspective view of a semiconductor device structure, in accordance with some embodiments. FIG. 7B is a top view of the semiconductor device structure of FIG. 7A, in accordance with some embodiments. FIG. 7C is a cross-sectional view illustrating the semiconductor device structure along a sectional line I-I' in FIG. 7B, in accordance with some embodiments.

After the steps of FIGS. 3A-3G are performed, as shown in FIGS. 7A-7C, a spacer layer 190, an insulating layer 210, a gate dielectric layer 220, a work function metal layer 230, and a gate electrode 240 are formed over the fin structures 116 and 118, the passivation layers D1 and D2, the liner layer 150, and the isolation layer 160, in accordance with some embodiments.

As shown in FIG. 7A, doped regions 119 are formed in the fin structures 116 and 118 and positioned on opposite sides of the gate electrode 240, in accordance with some embodiments. It should be noted that the elements in FIGS. 7A-7C, which are named and labeled identically to those in FIG. 4A, have materials and structures that are similar thereto or the same thereas. Therefore, detailed descriptions are not repeated herein.

As shown in FIGS. 7A-7C, the gate dielectric layer 220 is positioned between the gate electrode 240 and the fin structures 116 and 118 so as to separate the gate electrode 240 from the fin structures 116 and 118, in accordance with some embodiments. The gate dielectric layer 220 is positioned between the gate electrode 240 and the passivation layers D1 and D2 so as to separate the gate electrode 240 from the passivation layers D1 and D2, in accordance with some embodiments.

The gate dielectric layer 220 conformally covers the passivation layers D1 and D2, in accordance with some embodiments. The gate dielectric layer 220 is in direct contact with the passivation layers D1 and D2, in accordance with some embodiments.

As shown in FIG. 7A, the thickness T2 of the doped region 119 is greater than the thickness T1 of the passivation layer D1 or D2, in accordance with some embodiments. The thickness T3 of the gate dielectric layer 220 is greater than the thickness T1 of the passivation layer D1 or D2, in accordance with some embodiments.

In this step, a semiconductor device structure 700 is formed. In the semiconductor device structure 700, the gate electrode 240, the work function metal layer 230, and the gate dielectric layer 220 remaining in the opening 192 form a gate stack G2, in accordance with some embodiments. The gate stack G2 is also referred to as a metal gate stack, in accordance with some embodiments.

Figure 8:
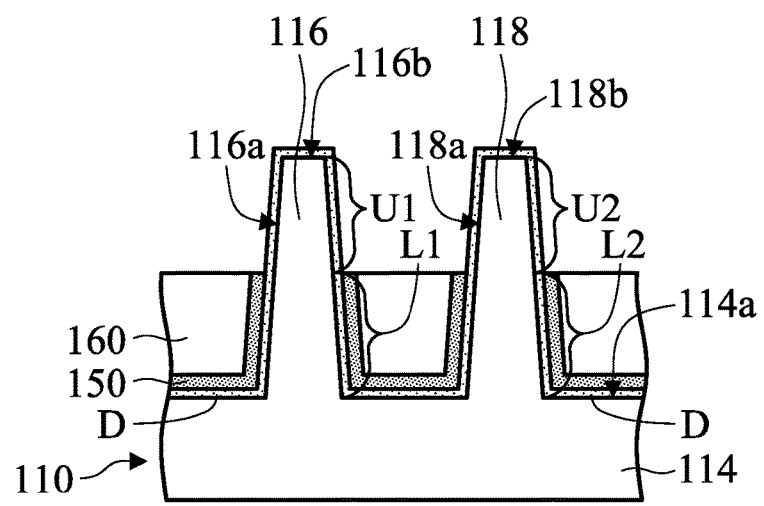
FIG. 8 is a cross-sectional view of a semiconductor device structure, in accordance with some embodiments.
Figure 9A:
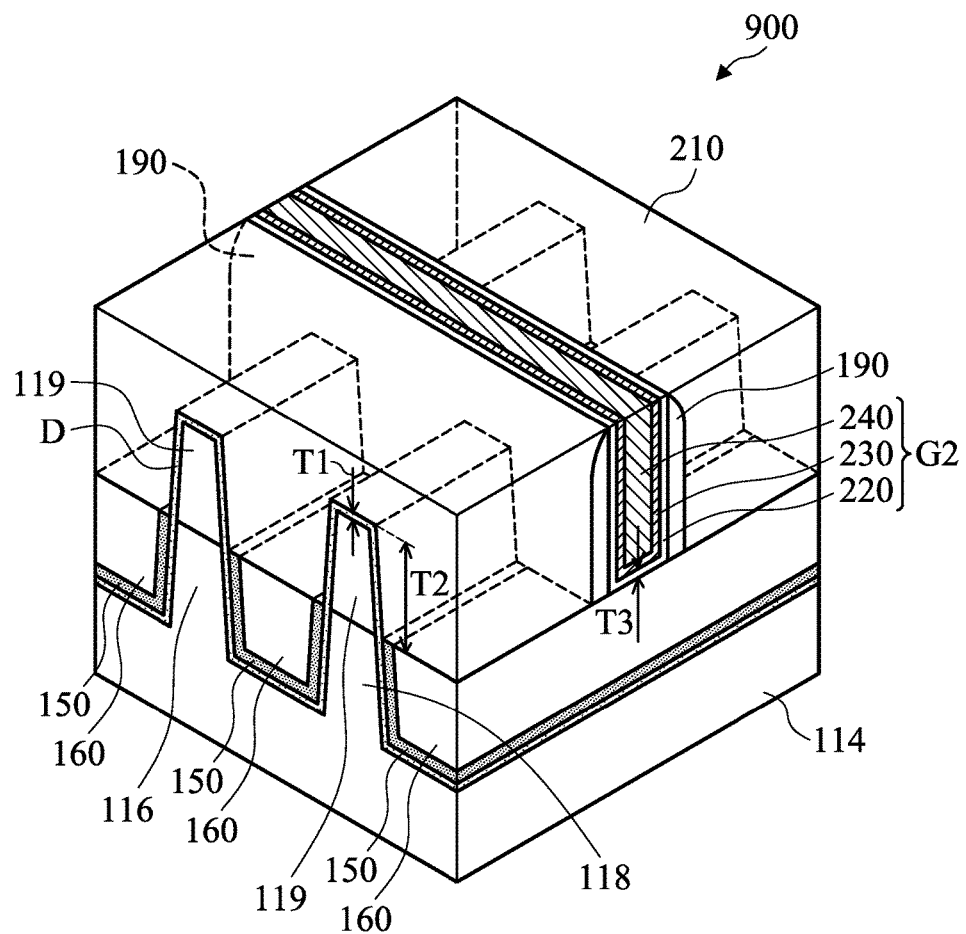
FIG. 9A is a perspective view of a semiconductor device structure, in accordance with some embodiments.
Figure 9B:
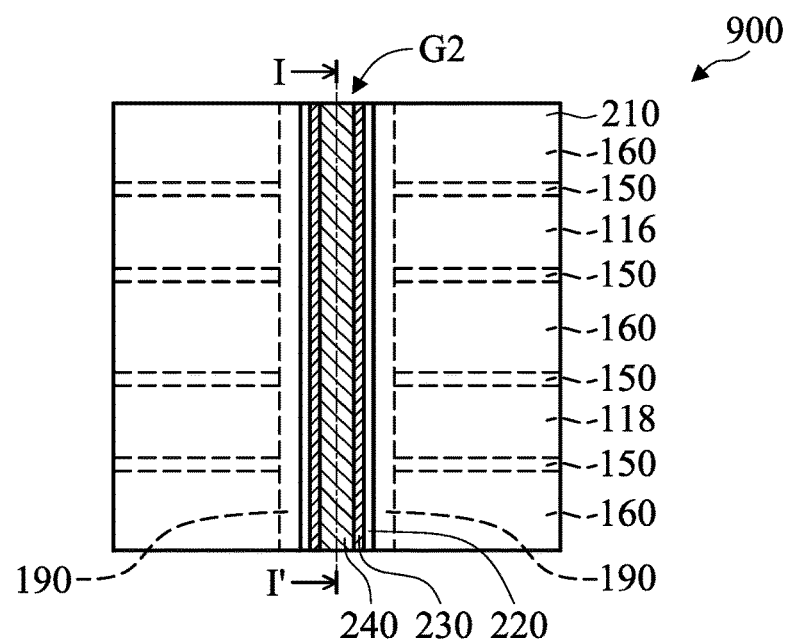
FIG. 9B is a top view of the semiconductor device structure of FIG. 9A, in accordance with some embodiments.
Figure 9C:
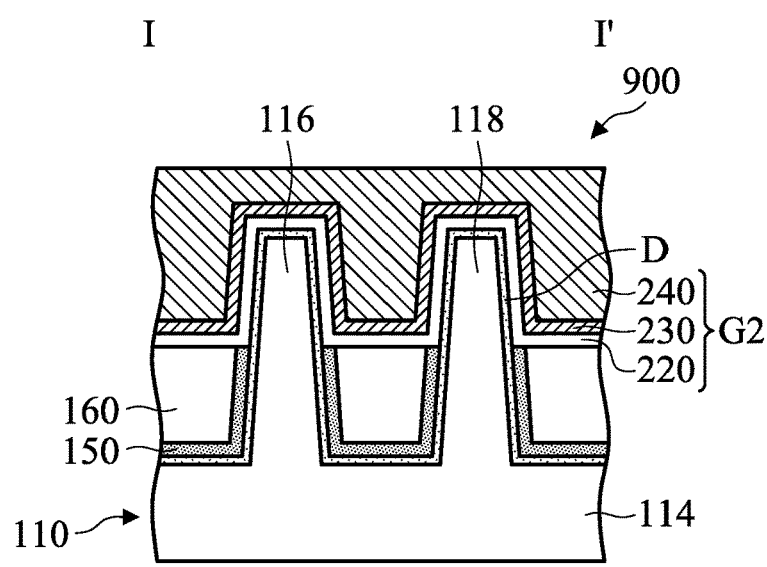
FIG. 9C is a cross-sectional view illustrating the semiconductor device structure along a sectional line I-I' in FIG. 9B, in accordance with some embodiments.

FIG. 8 is a cross-sectional view of a semiconductor device structure, in accordance with some embodiments. FIG. 9A is a perspective view of the semiconductor device structure of FIG. 8, in accordance with some embodiments. FIG. 9B is a top view of the semiconductor device structure of FIG. 9A, in accordance with some embodiments. FIG. 9C is a cross-sectional view illustrating the semiconductor device structure along a sectional line I-I' in FIG. 9B, in accordance with some embodiments.

After the steps of FIGS. 1A-1G, as shown in FIG. 8, a doping process or an ion implantation process is performed to implant dopants (not shown) into top surface portions of the fin structures 116 and 118 and the passivation layer D over the upper portions U1 and U2 of the sidewalls 116a and 118a, in accordance with some embodiments. The dopants include one or more elements selected from group 4A elements, in accordance with some embodiments. The dopants include carbon (C), germanium (Ge), tin (Sn), and/or lead (Pb).

The dopants used in the doping process or the ion implantation process of FIG. 8 and the dopants used in the doping process or the ion implantation process of FIG. 1C are made of the same material, in accordance with some embodiments. The top surface portions of the fin structures 116 and 118 and the dopants therein together form a portion of the passivation layer D, in accordance with some embodiments.

Therefore, the passivation layer D further extends onto the top surfaces 116b and 118b of the fin structures 116 and 118, in accordance with some embodiments. Therefore, the passivation layer D covers the top surfaces 116b and 118b and the sidewalls 116a and 118a of the fin structures 116 and 118 and the top surface 114a of the base 114, in accordance with some embodiments. The passivation layer D is a continuous passivation layer, in accordance with some embodiments.

Since the passivation layer D over the upper portions U1 and U2 of the sidewalls 116a and 118a are implanted or doped two times, the dopant concentration of the passivation layer D over the upper portions U1 and U2 is greater than the dopant concentration of the passivation layer D over the top surfaces 116b and 118b, the lower portions L1 and L2 of the sidewalls 116a and 118a, and the top surface 114a of the base 114, which are implanted or doped one time, in accordance with some embodiments.

After the steps of FIGS. 1H-3G, as shown in FIGS. 9A-9C, a spacer layer 190, an insulating layer 210, a gate dielectric layer 220, a work function metal layer 230, and a gate electrode 240 are formed over the fin structures 116 and 118, the passivation layer D, the liner layer 150, and the isolation layer 160, in accordance with some embodiments.

As shown in FIG. 9A, doped regions 119 are formed in the fin structures 116 and 118 and positioned on opposite sides of the gate electrode 240, in accordance with some embodiments. It should be noted that the elements in FIGS. 9A-9C, which are named and labeled identically to those in FIG. 4A, have materials and structures that are similar thereto or the same thereas. Therefore, detailed descriptions are not repeated herein.

The gate dielectric layer 220 is positioned between the gate electrode 240 and the fin structures 116 and 118 so as to separate the gate electrode 240 from the fin structures 116 and 118, in accordance with some embodiments. The gate dielectric layer 220 is positioned between the gate electrode 240 and the passivation layer D so as to separate the gate electrode 240 from the passivation layer D, in accordance with some embodiments.

The gate dielectric layer 220 conformally covers the passivation layer D, in accordance with some embodiments. The gate dielectric layer 220 is in direct contact with the passivation layer D, in accordance with some embodiments.

As shown in FIG. 9A, the thickness T2 of the doped region 119 is greater than the thickness T1 of the passivation layer D, in accordance with some embodiments. The thickness T3 of the gate dielectric layer 220 is greater than the thickness T1 of the passivation layer D, in accordance with some embodiments.

In this step, a semiconductor device structure 900 is formed. In the semiconductor device structure 900, the gate electrode 240, the work function metal layer 230, and the gate dielectric layer 220 remaining in the opening 192 form a gate stack G2, in accordance with some embodiments. The gate stack G2 is also referred to as a metal gate stack, in accordance with some embodiments.

In accordance with some embodiments, semiconductor device structures and methods for forming the same are provided. The methods (for forming the semiconductor device structure) form a passivation layer over sidewalls of a fin structure of a substrate before formations of a gate and an insulating layer surrounding the gate. Therefore, the passivation layer prevents the sidewalls of the fin structure from being oxidized during subsequent processes, such as processes for forming the gate and the insulating layer. As a result, the critical dimension (e.g. the width) and the profile of the fin structure are maintained by the passivation layer.

In accordance with some embodiments, a semiconductor device structure is provided. The semiconductor device structure includes a substrate having a base and a fin structure over the base. The fin structure has sidewalls. The semiconductor device structure includes a passivation layer over the sidewalls. The passivation layer includes dopants. The dopants include at least one element selected from group 4A elements, and the dopants and the substrate are made of different materials. The semiconductor device structure includes an isolation layer over the base and surrounding the fin structure and the passivation layer. A first upper portion of the fin structure and a second upper portion of the passivation layer protrude from the isolation layer. The semiconductor device structure includes a gate electrode over the first upper portion of the fin structure and the second upper portion of the passivation layer.

In accordance with some embodiments, a semiconductor device structure is provided. The semiconductor device structure includes a substrate having a base and a fin structure over the base. The fin structure has a first top surface and sidewalls adjacent to the first top surface. The semiconductor device structure includes a passivation layer covering the first top surface and upper portions of the sidewalls. The passivation layer includes dopants. The dopants include at least one element selected from group 4A elements, and the dopants and the substrate are made of different materials. The semiconductor device structure includes an isolation layer over the base and surrounding the fin structure. The semiconductor device structure includes a gate electrode over the fin structure and the passivation layer.

In accordance with some embodiments, a method for forming a semiconductor device structure is provided. The method includes forming a passivation layer over sidewalls of a fin structure of a substrate. The fin structure is over a base of the substrate. The passivation layer includes dopants including at least one element selected from group 4A elements, and the dopants and the substrate are made of different materials. The method includes forming an isolation layer over the base and surrounding a lower portion of the fin structure. The method includes forming a gate electrode over the fin structure and the passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a base and a fin structure over the base, wherein the fin structure has sidewalls and a top surface adjacent to the sidewalls;
   a passivation layer over the sidewalls, wherein the passivation layer comprises dopants, the dopants comprise at least one element selected from group 4A elements, the dopants and the substrate are made of different materials, the passivation layer and the fin structure have a top interface and a sidewall interface, and the top interface is directly below the top surface of the fin structure;
   an isolation layer over the base and surrounding the fin structure and the passivation layer, wherein a first upper portion of the fin structure and a second upper portion of the passivation layer protrude from the isolation layer, and the second upper portion of the passivation layer covers top portions of the sidewalls;
   a gate electrode over the first upper portion of the fin structure and the second upper portion of the passivation layer, wherein the second upper portion of the passivation layer is between the top portions of the sidewalls and the gate electrode; and
   a gate dielectric layer between the gate electrode and the fin structure and between the gate electrode and the second upper portion of the passivation layer, wherein a thickness of the gate dielectric layer is greater than a thickness of the passivation layer.

2. The semiconductor device structure as claimed in claim 1, wherein the passivation layer exposes the top surface.

3. The semiconductor device structure as claimed in claim 1, wherein the gate dielectric layer is in direct contact with the first upper portion of the fin structure, the second upper portion of the passivation layer, and the isolation layer, and the passivation layer separates the gate dielectric layer from the sidewalls.

4. The semiconductor device structure as claimed in claim 1, wherein the base has a top surface, and the passivation layer covers the top surface of the base.

5. The semiconductor device structure as claimed in claim 1, further comprising:
   a spacer layer surrounding the gate electrode and over the fin structure, the passivation layer, and the isolation layer.

6. The semiconductor device structure as claimed in claim 1, wherein the dopants comprise carbon.

7. The semiconductor device structure as claimed in claim 1, wherein the dopants comprise carbon and germanium.

8. The semiconductor device structure as claimed in claim 1, wherein the passivation layer comprises a first layer and a second layer, and the first layer is between the fin structure and the second layer, and
   wherein the first layer comprises a first dopant, the second layer comprises a second dopant, and an atomic radius of the first dopant is greater than an atomic layer of the second dopant.

9. A semiconductor device structure, comprising:
a substrate having a base and a fin structure over the base, wherein the fin structure has sidewalls and a top surface adjacent to the sidewalls;
a passivation layer over the sidewalls and the base, wherein the passivation layer comprises dopants, the dopants comprise tin or lead, the dopants and the substrate are made of different materials, the passivation layer extends from the base onto top portions of the sidewalls, the passivation layer and the fin structure have a top interface and a sidewall interface, and the top interface is directly below the top surface of the fin structure;
an isolation layer over the base and surrounding the fin structure and the passivation layer, wherein a first upper portion of the fin structure and a second upper portion of the passivation layer protrude from the isolation layer; and
a gate electrode over the first upper portion of the fin structure and the second upper portion of the passivation layer, wherein the passivation layer is between the gate electrode and the fin structure, and the second upper portion is between the top portions of the sidewalls and the gate electrode.

10. The semiconductor device structure as claimed in claim 9, further comprising:
a gate dielectric layer between the gate electrode and the fin structure and between the gate electrode and the passivation layer.

11. The semiconductor device structure as claimed in claim 10, wherein the gate dielectric layer conformally covers the fin structure, the second upper portion of the passivation layer, and the isolation layer.

12. The semiconductor device structure as claimed in claim 10, wherein the gate dielectric layer is in direct contact with the first upper portion of the fin structure, the second upper portion of the passivation layer, and the isolation layer.

13. The semiconductor device structure as claimed in claim 9, wherein the fin structure has a source region and a drain region on opposite sides of the gate electrode, and the passivation layer is on opposite sides of the source region and opposite sides of the drain region.

14. The semiconductor device structure as claimed in claim 13, wherein a thickness of the source region is greater than a thickness of the passivation layer.

15. A semiconductor device structure, comprising:
a substrate having a base and a fin structure over the base, wherein the tin structure has a first top surface and sidewalls, and the base has a second top surface;
a passivation layer covering the sidewalls and the second top surface, wherein the passivation layer comprises dopants, the dopants comprise at least one element selected from group 4A elements, the dopants and the substrate are made of different materials, a first top portion of the passivation layer covers second top portions of the sidewalls, and a third top surface of the passivation layer is partially and directly below the first top surface of the fin structure;
an isolation layer over the base and surrounding the fin structure and the passivation layer, wherein the passivation layer is partially below the isolation layer; and
a gate electrode over the fin structure, the passivation layer, and the isolation layer, wherein the first top portion is between the second top portions of the sidewalls and the gate electrode.

16. The semiconductor device structure as claimed in claim 15, wherein the first top surface is adjacent to the sidewalls, and the passivation layer exposes the first top surface.

17. The semiconductor device structure as claimed in claim 15, further comprising:
a liner layer between the passivation layer and the isolation layer, wherein the liner layer conformally covers the passivation layer, and the liner layer does not cover the first top portion over the second top portions of the sidewalls.

18. The semiconductor device structure as claimed in claim 17, further comprising:
a gate dielectric layer between the gate electrode and the fin structure and between the gate electrode and the passivation layer.

19. The semiconductor device structure as claimed in claim 18, wherein the gate dielectric layer conformally covers the fin structure, the passivation layer, the liner layer, and the isolation layer.

20. The semiconductor device structure as claimed in claim 18, wherein the gate dielectric layer is in direct contact with the fin structure, the passivation layer, the liner layer, and the isolation layer.

* * * * *